United States Patent [19]

Pace

[11] Patent Number: 4,929,851

[45] Date of Patent: May 29, 1990

[54] DATA LIMITER FOR A RADIO PAGER

[75] Inventor: Gary L. Pace, Boca Raton, Fla.

[73] Assignee: Motorola, Inc., Schaumburg, Ill.

[21] Appl. No.: 299,180

[22] Filed: Jan. 23, 1989

[51] Int. Cl.$^5$ .............................................. H03K 5/08
[52] U.S. Cl. .................................... 307/359; 307/555
[58] Field of Search ............... 307/359, 540, 546, 553,
307/555, 562

[56] References Cited

U.S. PATENT DOCUMENTS

| 3,576,449 | 4/1971 | Howell | 307/562 |
|---|---|---|---|
| 4,204,260 | 5/1980 | Nysen | 307/359 |
| 4,571,547 | 2/1986 | Day | 307/359 |
| 4,590,394 | 5/1986 | Pace | 307/549 |
| 4,602,374 | 7/1986 | Nakamura et al. | 307/359 |
| 4,631,737 | 12/1986 | Davis et al. | 375/88 |
| 4,866,261 | 9/1989 | Pace | 341/138 |

OTHER PUBLICATIONS

*Radio Shack Dictionary of Electronics*, editor Rudolf F. Graf, published by Howard W. Sams & Co., Inc., Indianapolis, Ind., 1975, pp. 111 and 610.

*Primary Examiner*—John Zazworsky
*Attorney, Agent, or Firm*—Vincent B. Ingrassia; Anthony J. Sarli, Jr.

[57] ABSTRACT

A data limiter for a radio pager is described in which an analog input signal including a data signal is compared in a comparator with a threshold voltage which is adjusted by means of a feedback network. The network consists of transconductance amplifiers having predetermined input offset voltages related to the amplitude of the analog signal which monitor the departure of the analog signal from a reference voltage to provide output currents which are integrated by an integrator and applied as the threshold voltage to the comparator and as the reference voltage to the transconductance amplifiers.

25 Claims, 6 Drawing Sheets

DATA LIMITER FOR A RADIO PAGER

This invention relates to a data limiter for a radio pager.

Radio pagers of necessity operate using batteries and utilize power saving techniques such as switching the receiver 'on' and 'off' in a cyclical manner in order to obtain the maximum possible life from the batteries. It is thus important to minimize the 'on' interval of the receiver. A significant factor affecting the receiver 'on' interval is the response time (time constant) of the data limiter.

The data limiter response time also limits how fast a radio pager recovers after the receiver has been captured by an adjacent channel or other undesired signal (during a fade, for example). An excessive recovery time can result in the unacceptable loss of transmitted data.

The data limiter is used to compare the audio output voltage, derived from the frequency discriminator of the receiver, with a threshold voltage to provide output data.

The audio output voltage supplied by the frequency discriminator has two components, namely the desired analog data signal and a DC offset voltage. The DC offset voltage is a function of RF carrier center frequency, local oscillator frequency and frequency discriminator component tolerances.

A significant time constant is associated with the establishment of an accurate threshold voltage in which the effects of the DC offset voltage are removed. An accurate threshold voltage cannot be determined until the data limiter has seen at least one transition of the analog data signal. There is thus a time delay for the provision of a valid data limiter output signal following the turning on of the receiver or following receiver capture by an adjacent channel or other undesired signal.

During battery saving operation, in which the receiver is 'on' when required and is then strobed 'off', a fast data limiter response time is required in order to reduce the receiver 'on' time and maximize battery life. A fast data limiter response time is also required in order to reduce radio pager recovery time following receiver capture by an extraneous signal. Otherwise, the loss of transmitted data may result.

One known data limiter includes a coupling capacitor for coupling the output voltage of the discriminator and such coupling capacitors have a relatively long time constant which results in a relatively long stabilization time for the data limiter following initial receiver power-up. Once the data limiter has stabilized following a first turn 'on', the established threshold is held during power 'off' in an analog memory means, such as a storage capacitor, to speed up stabilization on the following and subsequent turn 'on' times.

In addition to the problem of long stabilization time, the above known limiter suffers from an additional problem when a non-symmetrical bit pattern is received, such as a long string of zeros. In such cases the threshold used for the data limiter tends to drift towards the predominant data value, which can result in an invalid data limiter output.

Another known data limiter employs a peak and valley detector as disclosed in U.S. Pat. No. 4,631,737. This type of data limiter detects the peak level and valley level of the analog data signal and sets the threshold of the comparator of the data limiter at a value half way between the detected peak and valley values. Stabilization is more rapid than with the first described limiter.

The peak and valley limiter does not store the threshold between each turn 'on' of the receiver but rather stabilizes on each turn 'on'. Although stabilization is, as mentioned, more rapid than with the first described limiter, a turn-on delay is necessary to hold off operation of the peak and valley detector to allow stabilization of the receiver and prevent false setting of the threshold of the comparator. In addition, periodic initialization of the peak and valley detector levels is required to ensure that the threshold voltage properly tracks the analog data signal following receiver capture by an adjacent channel or other undesired signal.

A third prior art data limiter approach utilizing a voltage clamped input is disclosed in U.S. Pat. No. 4,590,394. This circuit stabilizes following each receiver turn 'on' and has a stabilization time similar to that of the peak and valley limiter. The voltage clamped input data limiter does not have the capability to store the threshold voltage and thus has a longer stabilization time when there are no data transitions during the first part of the receiver 'on' interval during battery saver operation. Another problem is the inability to pass an arbitrary bit pattern, such as an extremely long string of 1's or 0's.

There is thus a need for a data limiter having a response time following turn on, which is relatively independent of the particular bit pattern being received. Additionally, for optimum battery life and performance, a data limiter is required which while maintaining the capability to pass an arbitrary bit pattern, such as a long string of 1's and 0's, also provides a fast response time;

(a) following initial receiver power up;

(b) during each subsequent strobe to turn the receiver 'on' with minimum or zero dependence on the received bit pattern; and (c) following receiver capture by an adjacent channel or other undesired signal.

According to the invention there is provided a data limiter, comprising;

comparison means having a first input for receiving a first signal, and a second input for receiving a reference signal; first and second transconductance amplifiers, each having a first input coupled to receive the first signal, a second input for receiving the reference signal, and an output, each amplifier having a respective predetermined input offset; and an integrator having an input coupled to the outputs of the first and second transconductance amplifiers and an output coupled to the second input of the comparison means and to the second inputs of each of the first and second amplifiers to provide the reference signal.

Preferably the input offset voltages of the first and second transconductance amplifiers are of opposite polarity to one another and approximately equal to one half of the peak-to-peak amplitude of the analog signal.

Advantageously the integrator is a digital integrator. An exemplary embodiment of the invention will now be described with reference to the accompanying drawings in which;

Figure 1:
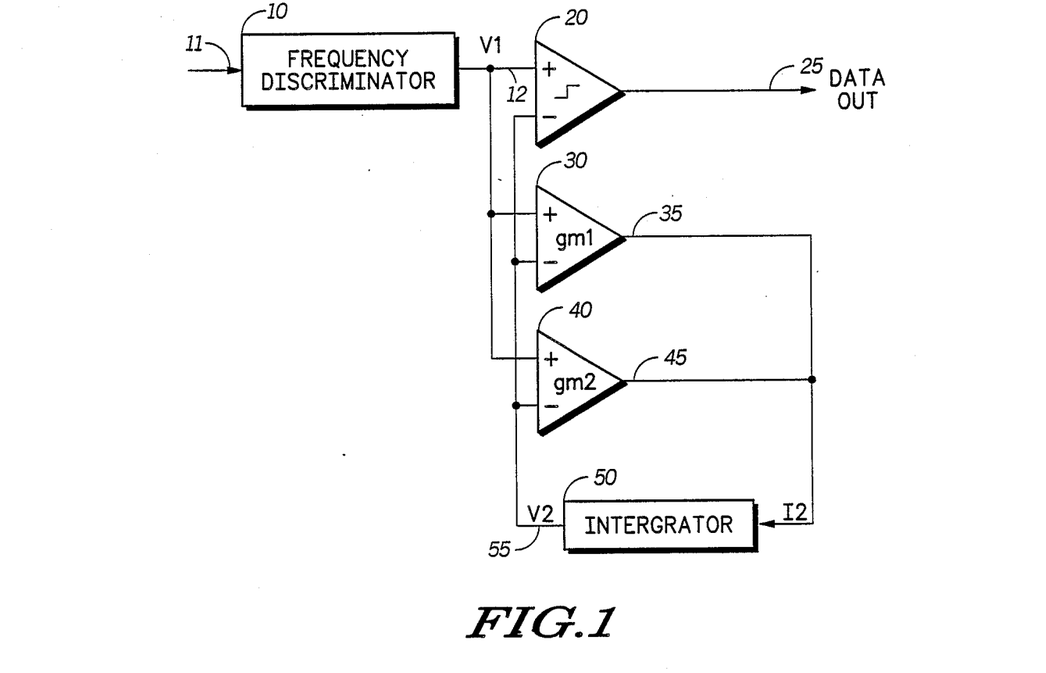
FIG. 1 is a schematic block diagram of an embodiment of a data limiter in accordance with the invention.
Figure 1A:
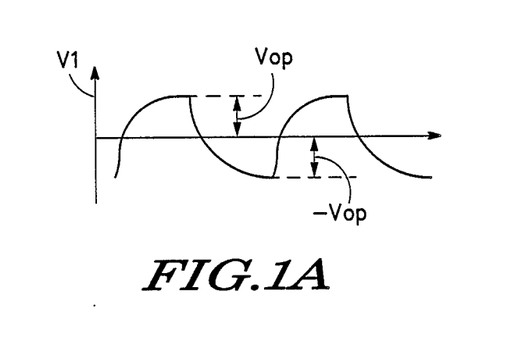
FIG. 1a illustrates the input analog signal waveform.

Referring to FIGS. 1 and 1a, a frequency discriminator 10 forming part of a radio pager has an input 11 and an output 12 at which is provided an analog audio signal V1 as shown in FIG. 1a. The analog signal has a peak-to-peak amplitude of 2Vop and is symmetrical about a datum level with a positive amplitude Vop and a negative amplitude −Vop with respect to the datum level.

The analog audio signal is applied to the non-inverting input of a voltage comparator 20 and to the non-inverting inputs of each of two transconductance amplifiers 30 and 40. The comparator 20 has an output 25 which provides the data output of the data limiter. The transconductance amplifiers 30 and 40 have respective outputs 35 and 45 which are coupled to an integrator 50 having an output 55 coupled to the inverting inputs of the voltage comparator 20 and the transconductance amplifiers 30 and 40. The output V2 of the integrator 50 thus provides the threshold voltage for the voltage comparator 20 and the reference voltages for each of the transconductance amplifiers 30 and 40.

Each of the transconductance amplifiers 30 and 40 has a predetermined input offset voltage which in a preferred embodiment is approximately equal to one half of the peak-to-peak voltage amplitude of the analog audio signal but of opposite polarity to one another. Thus the amplifier 30 has an input offset voltage of approximately Vop and that of the amplifier 40 is −Vop.

The arrangement is configured as a feed back system which adjusts the threshold for the voltage comparator 20 so as to track the analog signal and thus reduce the required response time following a power-on strobe.

The transconductance amplifier 30 sources an output current at its output 35 if the analog voltage applied to its non-inverting input exceeds the reference voltage applied to the inverting input by the amount of the input offset voltage Vop of the amplifier. Otherwise, the output current of the amplifier 30 is zero. The amount of current sourced will increase with increasing amplitude of the analog signal, once the offset voltage is overcome.

The transconductance amplifier 40, in similar manner, sinks a proportional output current whenever the analog voltage at its non-inverting input is less than the reference voltage applied to its inverting input by the amount of the input offset voltage −Vop. Otherwise, its output current is zero.

Current I2 provided at the output of the amplifiers 30 and 40 is integrated by the integrator 50 and the output voltage V2 of the integrator is applied to the inverting input of the voltage comparator 20 as a threshold voltage and as a reference voltage to the inverting inputs of each of the amplifiers 30 and 40.

The transconductance amplifiers 30 and 40 and the integrator 50 extract the offset voltage from the analog input signal with a time constant T1 determined by the integrator gain K and the gains gm1, gm2 of the amplifiers 30 and 40 where $$V2 = K \int_0^t I_2 \, dt$$

Typically gm1=gm2, and T1 is given approximately by:

$$T1 = \frac{1}{(gm1)(K)}$$

where time constant T1 is set approximately equal to one bit period of the data.

Thus whenever the analog input voltage V1 is greater than or less than the integrator output voltage V2 by the amount of Vop, one of the transconductance amplifiers 30, 40 will deliver an output current I2 to the integrator 50. This will cause the integrator output voltage V2 and hence the threshold voltage of the comparator 20 to be adjusted to a value which results in a valid data limiter output.

Once equilibrium is reached the output currents of both the transconductance amplifiers 30, 40 will approach zero and the data limiter input threshold voltage will be stored in the integrator 50. The feedback operation and storage of the comparator threshold on the integrator allows a bit pattern with an extremely long string of 1's or 0's to be processed accurately.

The integrator 50 may be a simple capacitor integrator but is preferably a digital integrator of the type disclosed in U.S. Pat. No. 4,866,261 incorporated herein by reference.

During initial power-up of the circuit and on each subsequent receiver 'on' strobe, a short stabilization period is required for the integrator output (data limiter input threshold voltage) to reach the correct level. At least one transition of the analog data signal is required during this period. After this interval, the data limiter output will be valid.

In battery saver applications, the data limiter stabilization time can be further reduced after the first receiver turn-on by eliminating the need for the data limiter circuit to see any transitions of the analog data signal. This can be accomplished by storing the data limiter input threshold voltage in the integrator during the receiver 'off' interval and during the initial portion of the 'on' interval in which the analog audio signal has not stabilized. For receivers which provide a valid analog audio signal within an interval following turn on which is small in comparison to one bit period, the receiver battery saver strobe can be used as the control signal to store the limiter threshold voltage. The storage of the limiter threshold voltage in data limiters using a simple capacitor integrator is accomplished by disabling both transconductance amplifiers to ensure no output current. For digital integrators, of the above mentioned U.S. Pat. No. 4,866,261, power is maintained to the up/down counter during the "OFF" interval and the transconductance amplifiers disabled so that the digital equivalent of the data limiter threshold voltage can be stored in the up/down counter. Alternately, the data limiter threshold voltage can be stored by activating the integrator hold control.

The data limiter of the invention has the capability to recover quickly following an interval in which the receiver has been captured by an adjacent channel or other undesired signal. This is accomplished without the need for a turn-on delay or periodic initialization, as is the case for some prior art limiters.

Figure 2:
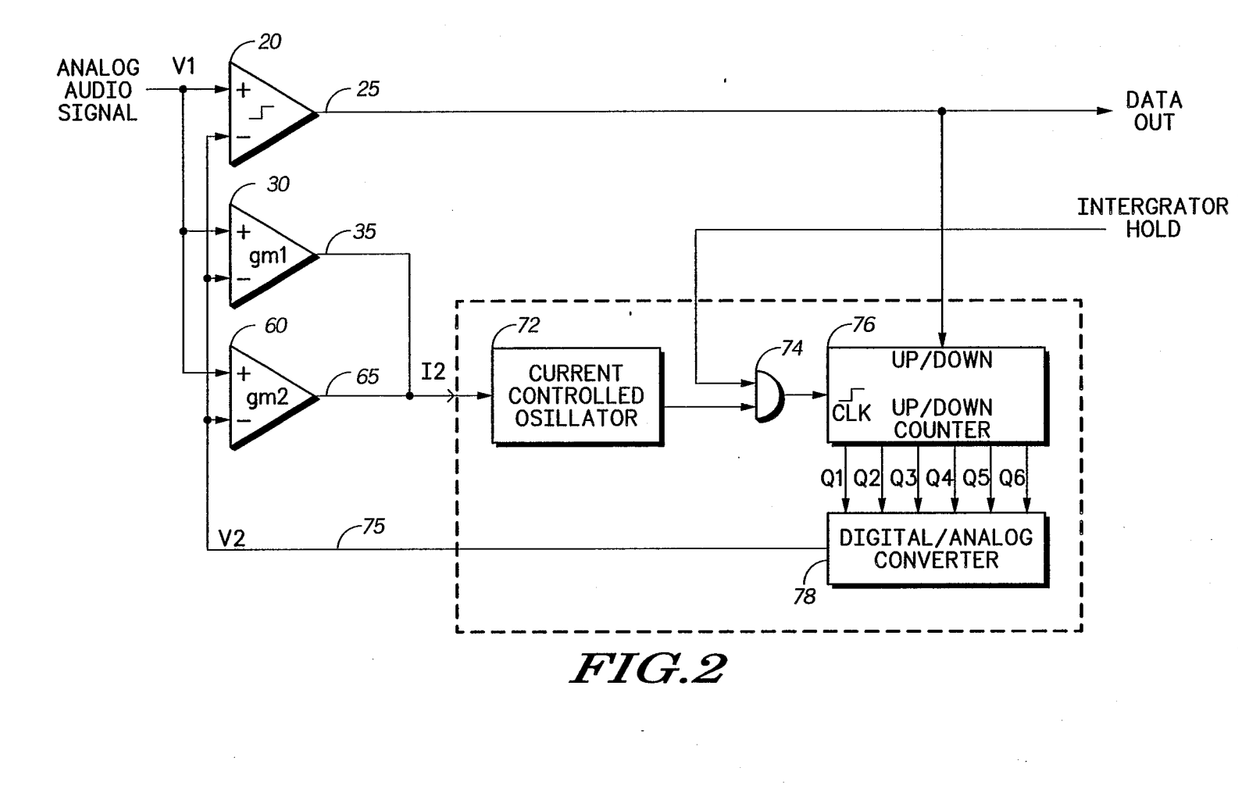
FIG. 2 is a schematic block diagram of another embodiment of the present invention.

Turning to FIG. 2, a second embodiment of the data limiter circuit is shown. The circuit of FIG. 2 is similar to the data limiter circuit in FIG. 1. The transconductance amplifier 40 of FIG. 1 has been replaced by transconductance amplifier 60 with identical characteristics to amplifier 30. The connections to the inverting and non-inverting inputs of amplifier 60 in FIG. 2 have been reversed from that described for amplifier 40 in FIG. 1. Both transconductance amplifiers 30 and 60 in FIG. 2 can only source an output current, whereas in FIG. 1, amplifier 30 can only source an output current and amplifier 40 can only sink an output current. The integrator 50 in FIG. 1 has been replaced by digital integrator 70 which utilizes the output 25 of voltage comparator 20 to simplify the digital implementation of integrator 50.

The analog audio signal V1 as shown in FIG. 1a with a peak-to-peak amplitude of 2Vop is applied to the non-inverting input of a voltage comparator 20, to the non-inverting input of transconductance amplifier 30 and to the inverting input of transconductance amplifier 60. The comparator 20 has an output 25 which is coupled to the up/down input of up/down counter 76 of the digital integrator 70. Output 25 provides the data output of the data limiter. The transconductance amplifiers 30 and 60 have respective outputs 35 and 65 which are coupled to the input of current controlled oscillator 72 of the digital integrator 70.

Digital integrator 70 is composed of a current controlled oscillator 72, an AND gate 74, and up/down counter 76 and a digital-to-analog converter 78. The oscillator 72 generates an output frequency which is directly proportional to the input current $I_2$. The output from the oscillator 72 is applied to one input of an AND gate 74. The other input of the AND gate 74 serves as an integrator hold control. The output from AND gate 74 drives the up/down counter 76 which in turn drives the digital-to-analog converter 78. The output 75 (V2) of the digital-to-analog converter 78 is applied to the inverting input of the voltage comparator 20 as a threshold voltage and as a reference voltage to the inverting input of amplifier 30 and non-inverting input of amplifier 60. The AND gate 74 is optional and not required for the basic operation of the integrating means. Although FIG. 2 illustrates a 6 bit digital-to-analog converter, other size converters can be used.

Each of the transconductance amplifiers 30 and 60 has a predetermined input offset voltage which is approximately equal to one half of the peak-to-peak amplitude of the analog audio signal V1. Therefore, amplifiers 30 and 60 have an input offset voltage of approximately Vop. Unlike transconductance amplifiers 30 and 40 of FIG. 1, the input offset voltages of amplifiers 30 and 60 in FIG. 2 have the same polarity.

Operation of the data limiter circuit in FIG. 2 is similar to that of the circuit in FIG. 1. The transconductance amplifier 30 sources a proportional output current at its output 35 if the analog voltage applied to the non-inverting input exceeds the reference voltage applied to the inverting input by the amount of the input offset voltage Vop of the amplifier. Otherwise, the output current of the amplifier 30 is zero. In a similar manner, the transconductance amplifier 60 sources a proportional output current at its output 65 whenever the analog voltage at its inverting input is less than the reference voltage applied to its non-inverting input by the amount of the input offset voltage Vop. Otherwise, its output current is zero.

The current $I_2$ provided at the output of the amplifiers 30 and 60 is applied to current controlled oscillator 72 of digital integrator 70. When AND gate 74 is enabled by the integrator hold control, the output frequency of oscillator 72 will cause up/down counter 76 to count in a direction controlled by output 25 of voltage comparator 20. The direction of count is up when output 25 is high and down when output 25 is low. The output of up/down counter 76 will then cause the output voltage V2 of digital-to-analog converter 78 to change in the direction which minimizes the output current $I_2$ of amplifiers 30 and 60. Equilibrium will be reached and output current $I_2$ will approach zero when integrator output voltage V2 is adjusted to a level such that the voltage excursions of analog input voltage V1 do not exceed the input offset voltages of both transconductance amplifiers 30 and 60. At this time the integrator output voltage V2 and hence the threshold voltage of the voltage comparator 20 will be at the level which results in a valid data limiter output.

As previously discussed in reference to FIG. 1, data limiter stabilization time can be further reduced in battery saver applications by storing the limiter input threshold voltage in the integrator during the receiver 'off' interval This can be accomplished in the circuit of FIG. 2 by activation of the integrator hold input to AND gate 74 which inhibits the clock input to up/down counter 76 and causes the digital equivalent of the data limiter threshold voltage V2 to be stored in the up/down counter 76.

The data limiter circuit of FIG. 2, while not being suitable for use with the simple capacitor integrator allowed by the circuit of FIG. 1, has the advantage that the digital integrator can be more simply implemented. That is, the absolute value circuit and polarity detector required in the digital integrator circuit disclosed in the above mentioned U.S. Pat. No. 4,866,261 are not needed in the digital integrator of FIG. 2.

Figure 3:
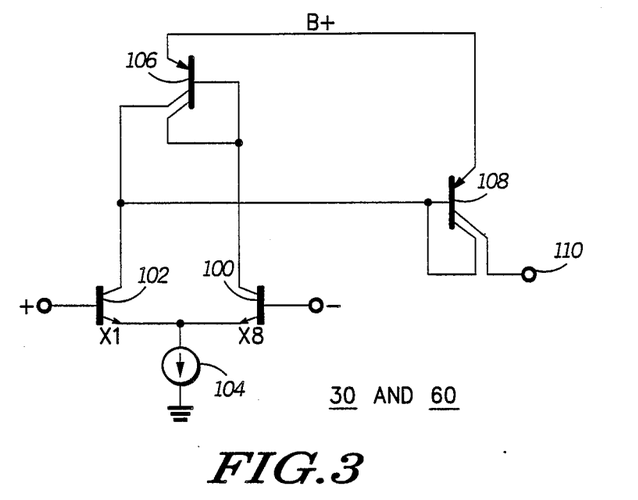
FIG. 3 shows a more detailed schematic of the transconductance amplifiers 30 and 60 utilized in FIGS. 1 and 2.

Referring now to FIG. 3, a preferred configuration of transconductance amplifier 30 is shown. Although the following description refers only to transconductance amplifier 30, it should be understood that transconductance amplifier 60 has identical characteristics. Transconductance amplifier 30 includes NPN transistors 100 and 102 which have their emitters coupled together to form a differential amplifier configuration. The junction of their emitters is coupled through a current source 104 to ground. The base of transistor 100 forms the inverting input of amplifier 30 while the base of transistor 102 forms the non-inverting input of amplifier 30. The ratio of the area of the emitters of transistors 100 and 102 is scaled at a ratio of 8 to 1 as shown with the emitter of transistor 100 having 8 times the area of transistor 102 in order to provide a 54 millivolt offset voltage. By adjusting this ratio, the offset voltage may be changed to match one half the peak-to-peak amplitude output of the frequency discriminator.

Two PNP transistors 106 and 108, each having two collectors, have their emitters coupled to B+. Transistor 106 has a first of the collectors coupled back to its base and coupled to the collector of transistor 100. The second collector of transistor 106 is coupled to the collector of transistor 102 and to the base and first collector of transistor 108. The second collector of transistor 108 provides the amplifiers' output 110. the connection of PNP transistor 108 in a current mirror configuration ensures that transconductance amplifier 30 can source but never sink an output current. Transconductance amplifier 30 can be disabled by setting current source 104 to zero.

Figure 4:
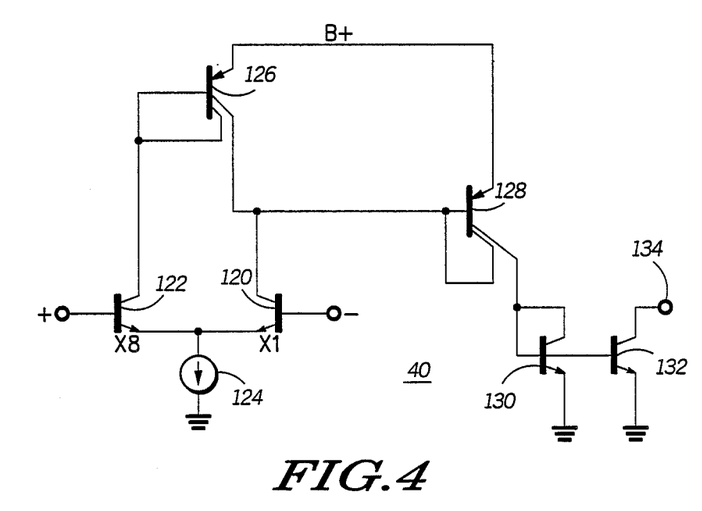
FIG. 4 shows a more detailed schematic of the transconductance amplifier 40 utilized in FIG. 1.

Turning now to FIG. 4, a detailed schematic of a preferred transconductance amplifier suitable for use as amplifier 40 is shown. Amplifier 40 includes a pair of transistors 120 and 122, both NPN, which have their emitters connected to form a differential amplifier. The emitters are coupled through current source 124 to ground. In this amplifier the emitter area of transistor 122 is 8 times the emitter area of transistor 120 to provide a 54 millivolt offset voltage. The base of transistor 120 forms the inverting input of the amplifier, while the base of transistor 122 forms the non-inverting input of the amplifier.

Two PNP transistors 126 and 128, each having two collectors, have their emitters coupled to B+. Transistor 126 has a first of the collectors coupled back to its base and coupled to the collector of transistor 122. The second collector of transistor 126 is coupled to the collector of transistor 120 and to the base and first collector of transistor 128. The second collector of transistor 128 is coupled to the base of NPN transistor 132 and to the base and collector of NPN transistor 130. The emitters of transistors 130 and 132 are coupled to ground. The collector of transistor 132 provides the amplifiers' output 134. The connection of NPN transistors 130 and 132 in a current mirror configuration ensures that transconductance amplifier 40 can sink but never source an output current. Transconductance amplifier 40 can be disabled by setting current source 124 to zero.

Referring now to FIGS. 5 to 8 there is shown a series of explanatory graphs of the operation of the data limiter of the invention under various conditions, compared with the peak and valley data limiter.

Figure 5:
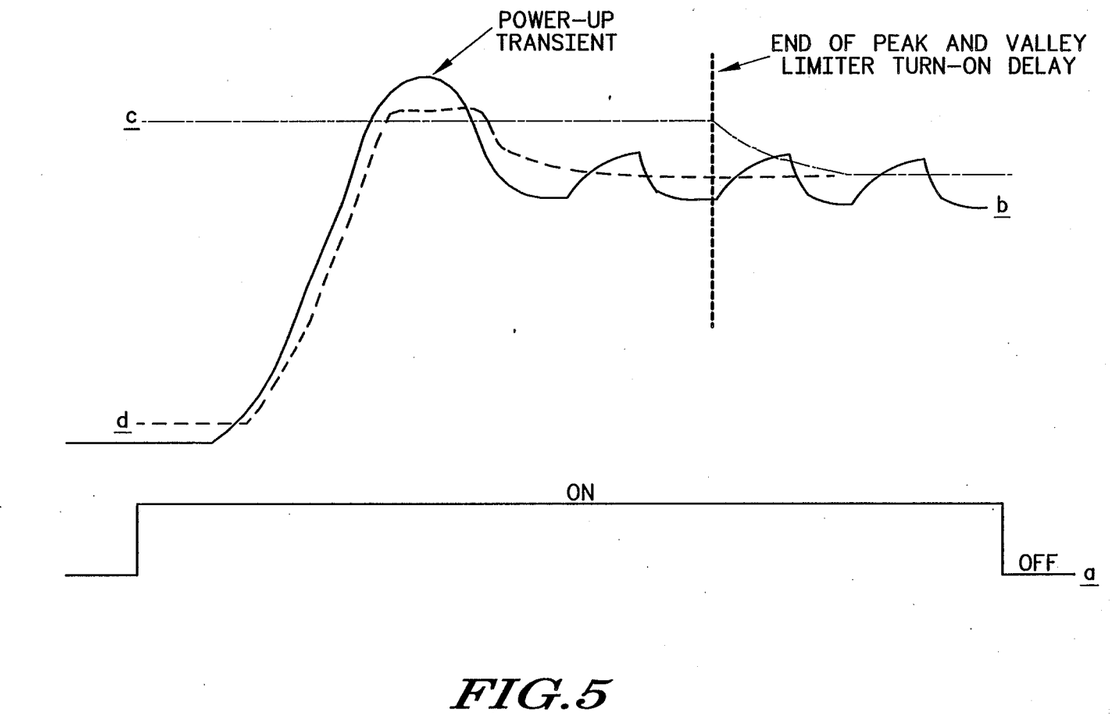
FIGS. 5 to 8 are explanatory graphs.

FIG. 5 illustrates the threshold voltage of the data limiter following receiver turn on. Curve a shows the receiver strobe pulse, curve b illustrates the analog signal output of the frequency discriminator, curve c is the threshold for the peak and valley data limiter, which is a data limiter having a peak and valley detector, and curve d is the threshold voltage for the limiter of the invention. Note that to achieve a valid data limiter output the limiter threshold voltage must track the analog signal input and remain approximately centered between the peak level and valley level of the analog signal. The accuracy of the rapid tracking of the analog audio signal by the limiter of the invention is clearly evident.

Figure 6:
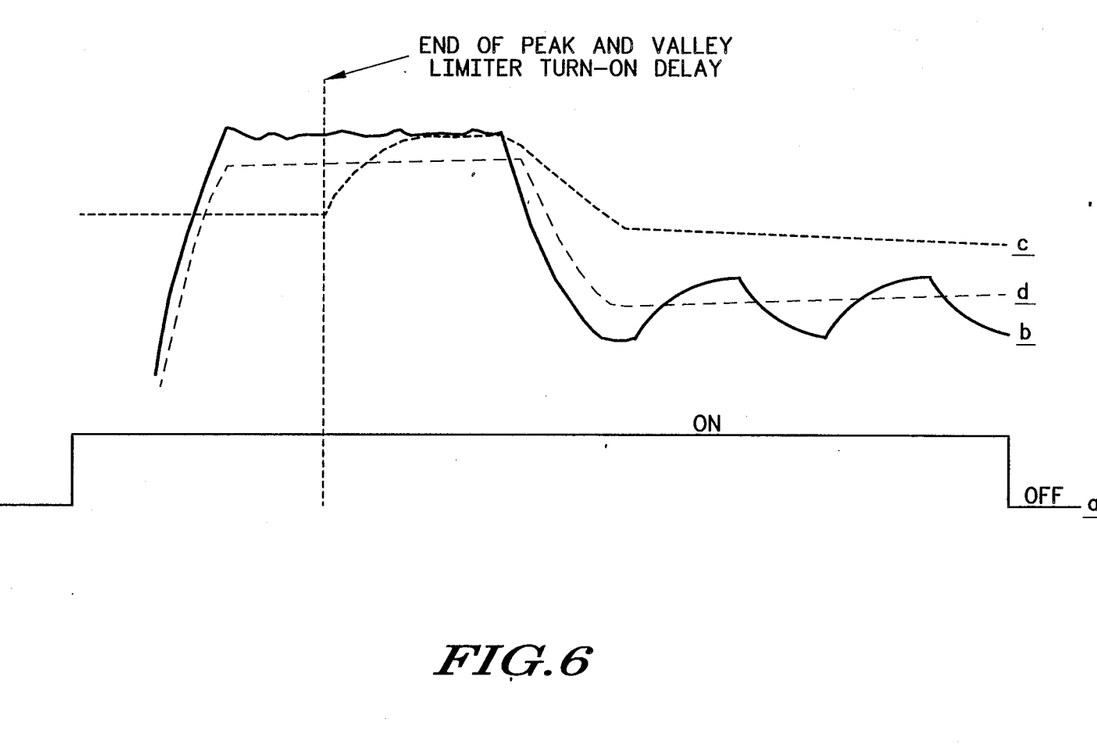

FIG. 6 shows the same curves following a receiver turn-on pulse in the case of the receiver being temporarily captured by an adjacent channel or other undesired signal. Note the improved tracking of the analog audio signal by the limiter of the invention.

Figure 7:
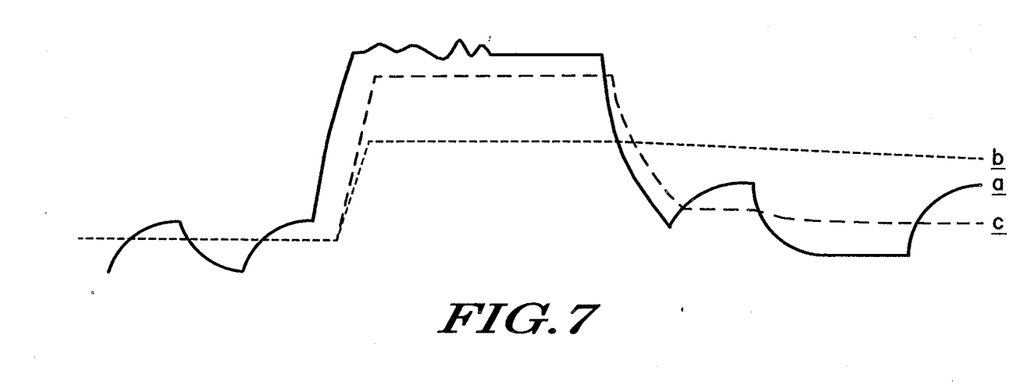

FIG. 7 shows the limiter threshold voltages in the case of the receiver being temporarily captured by an adjacent channel or other undesired signal during the time that the radio pager is decoding a transmitted bit pattern. In this figure curve a is the analog audio signal, curve b the threshold voltage for the peak and valley type limiter and curve c is for the data limiter of the invention.

Figure 8:
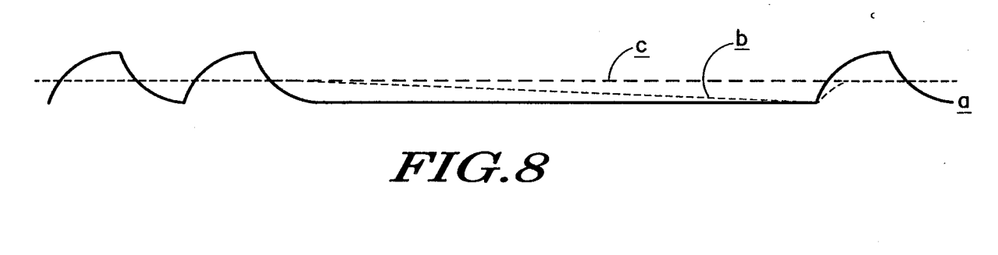

FIG. 8 shows the same curves for the case of a long stream of 0 bits.

I claim:

1. A data limiter, comprising:
   comparison means having a first input for receiving a first signal and a second input for receiving a reference signal;
   first and second transconductance amplifiers, each having a first input coupled to receive said first signal, a second input coupled to receive said reference signal, and an output, each amplifier having a respective predetermined input offset voltage; and
   an integrator having an input coupled to the outputs of said first and second transconductance amplifiers and an output coupled to the second input of said comparison means and to the second inputs of each of said first and second amplifiers to provide said reference signal.

2. A data limiter according to claim 1 wherein said comparison means is a voltage comparator.

3. A data limiter according to claim 2 wherein said first signal is an analog signal including a data signal, and said reference signal is a reference voltage.

4. A data limiter according to claim 3 wherein the input offset voltages of the first and second transconductance amplifiers are opposite polarity and are approximately equal to one half of the peak-to-peak amplitude of the analog signal.

5. A data limiter according to claim 4 wherein said integrator is an analog integrator.

6. A data limiter according to claim 3 wherein the input offset voltages of the first and second transconductance amplifiers are of the same polarity and are approximately equal to one-half of the peak-to-peak amplitude of the analog signal.

7. A data limiter according to claim 6 wherein said first amplifier sources a current to its output when the amplitude of the analog signal exceeds the reference voltage by the amount of its input offset voltage and the second amplifier sources current to its output when the amplitude to the analog signal is less than the reference voltage by the amount of its input offset voltage.

8. An apparatus according to claim 7 wherein said integrator is digital and comprises:
   a current control oscillator having an input coupled to the output of said first and second amplifiers for generating an output;
   an up/down counter having a control input coupled to the output of said comparator and a count input coupled to the output of said oscillator, said counter having a plurality of outputs; and
   a digital to analog converter having inputs coupled to said plurality of outputs and having an output coupled to said first and second amplifiers and to said comparator.

9. An apparatus according to claim 8 wherein the output of said oscillator has a frequency which is proportional to a current at its input.

10. A data limiter, comprising:
    a voltage comparator having a first input for receiving an analog signal including a data signal and a second input for receiving a reference voltage;
    first and second transconductance amplifiers, each having a first input coupled to receive said analog signal, a second input coupled to receive said reference voltage, and an output, each amplifier having a respective predetermined input offset voltage, wherein the input offset voltages of the first and second transconductance amplifiers are opposite polarity and are approximately equal to one half of the peak-to-peak amplitude of the analog signal, and wherein said first amplifier sources a current to its output when the amplitude of the analog signal exceeds the reference voltage by the amount of its input offset voltage, and the second amplifier sinks current from its output when the amplitude of the analog signal is less than the reference voltage by the amount of its input offset voltage; and an integrator having an input coupled to the outputs of said first and second transconductance amplifiers and an output coupled to the second input of said voltage comparator and to the second inputs of each of said first and second amplifiers to provide said reference voltage.

11. A data limiter according to claim 10 wherein said integrator is a digital integrator.

12. A data limiter, comprising;
a voltage comparator having a first input for receiving an analog signal including a data signal and a second input for receiving a reference voltage;
first and second transconductance amplifiers, each having a first input coupled to receive said analog signal, a second input coupled to receive said reference voltage, and an output, each amplifier having a respective predetermined input offset voltage, wherein the input offset voltages of the first and second transconductance amplifiers are opposite polarity and are approximately equal to one half of the peak-to-peak amplitude of the analog signal; and
a digital integrator having an input coupled to the outputs of said first and second transconductance amplifiers and an output coupled to the second input of said voltage comparator and to the second inputs of each of said first and second amplifiers to provide said reference voltage.

13. A data limiter according to claim 12 wherein said first amplifier sources a current to its output when the amplitude of the analog signal exceeds the reference voltage by the amount of its input offset voltage, and the second amplifier sinks current from its output when the amplitude of the analog signal is less than the reference voltage by the amount of its input offset voltage.

14. A method of comparing an audio signal with a threshold voltage comprising the steps of:
comparing said audio signal and said threshold voltage in first and second transconductance amplifiers each having a predetermined input offset voltage; and
integrating the outputs of said first and second amplifiers to alter said threshold voltage.

15. A data limiter, comprising:
comparison means having a first input for receiving a first signal and a second input for receiving a reference signal;
first and second transconductance amplifiers, each having a first input coupled to receive said fist signal, a second input coupled to receive said reference signals, and an output connected to a node, each amplifier having a respective predetermined input offset voltage; and an integrator having an input coupled to the node and an output coupled to the second input of said comparison means and to the second inputs of each of said first and second amplifiers to provide said reference signal.

16. A data limiter according to claim 15 wherein said comparison means is a voltage comparator.

17. A data limiter according to claim 16 wherein said first signal is an analog signal including a data signal, and said reference signal is a reference voltage.

18. A data limiter according to claim 17 wherein the input offset voltages of the first and second transconductance amplifiers are opposite polarity and are approximately equal to one half of the peak-to-peak amplitude of the analog signal.

19. A data limiter according to claim 18 wherein said first amplifier sources a current to its output when the amplitude of the analog signal exceeds the reference voltage by the amount of its inputs offset voltage, and the second amplifier sinks current from its output when the amplitude of the analog signal is less than the reference voltage by the amount of its input offset voltage.

20. A data limiter according to claim 18 wherein said integrator is an analog integrator.

21. A data limiter according to claim 18 wherein said integrator is a digital integrator.

22. A data limiter according to claim 17 wherein the input offset voltages of the first and second transconductance amplifiers are of the same polarity and are approximately equal to one-half of the peak-to-peak amplitude of the analog signal.

23. A data limiter according to claim 22 wherein said first amplifier sources a current to its output when the amplitude of the analog signal exceeds the reference voltage by the amount of its input offset voltage and the second amplifier sources current to its output when the amplitude to the analog signal is less than the reference voltage by the amount of its input offset voltage.

24. An apparatus according to claim 23 wherein said integrator is digital and comprises:
a current control oscillator having an input coupled to the output of said first and second amplifiers for generating an output;
an up/down counter having a control input coupled to the output of said comparator and a count input coupled to the output of said oscillator, said counter having a plurality of outputs; and
a digital to analog converter having inputs coupled to said plurality of outputs and having an output coupled to said first and second amplifiers and to said comparator.

25. An apparatus according to claim 24 wherein the output of said oscillator has a frequency which is proportional to a current at its input.

* * * * *

UNITED STATES PATENT AND TRADEMARK OFFICE
CERTIFICATE OF CORRECTION

PATENT NO. : 4,929,851

DATED : May 29, 1990

INVENTOR(S) : Gary L. Pace

It is certified that error appears in the above-identified patent and that said Letters Patent is hereby corrected as shown below:

Fig. 2, the "+" and "-" terminals of amplifier 60 should be reversed, and the dotted box should be labeled "70". (see attached sheet)

Signed and Sealed this

First Day of October, 1991

Attest:

Attesting Officer

HARRY F. MANBECK, JR.

Commissioner of Patents and Trademarks

UNITED STATES PATENT AND TRADEMARK OFFICE
CERTIFICATE OF CORRECTION

PATENT NO. : 4,929,851

DATED : May 29, 1990

INVENTOR(S) : Gary L. Pace

It is certified that error appears in the above-identified patent and that said Letters Patent is hereby corrected as shown below:

FIG. 2, the "+" and "-" terminals of amplifier 60 should be reversed, and the dotted box should be labeled "70".